United States Patent [19]
Yuuki

[11] Patent Number: 5,741,731
[45] Date of Patent: Apr. 21, 1998

[54] A SEMICONDUCTOR DEVICE WIRED WITH FUSE

[75] Inventor: Tomohiro Yuuki, Hamamatsu, Japan

[73] Assignee: Yamaha Corporation, Japan

[21] Appl. No.: 570,105

[22] Filed: Dec. 11, 1995

[30] Foreign Application Priority Data

Dec. 19, 1994 [JP] Japan ............................... 6-315108

[51] Int. Cl.$^6$ .................................................. H04L 21/82
[52] U.S. Cl. .......................... 438/132; 438/130; 438/467; 438/659
[58] Field of Search ........................... 438/132, 131, 438/130, 467, 528, 532, 658, 659, 433; 148/DIG. 55

[56] References Cited

U.S. PATENT DOCUMENTS

| | | |
|---|---|---|
| 4,814,285 | 3/1989 | Matlock et al. ................. 438/659 |
| 4,835,118 | 5/1989 | Jones, Jr. et al. ................ 438/131 |
| 5,017,510 | 5/1991 | Welch et al. ................ 148/DIG. 55 |
| 5,087,589 | 2/1992 | Chapman et al. ................. 438/467 |
| 5,468,680 | 11/1995 | Cohen ........................ 148/DIG. 55 |

FOREIGN PATENT DOCUMENTS

| | | | |
|---|---|---|---|
| 57-109191 | 7/1982 | Japan | 148/DIG. 55 |
| 62-208664 | 9/1987 | Japan | 148/DIG. 55 |
| 1-220471 | 9/1989 | Japan | 148/DIG. 55 |
| 5-90412 | 4/1993 | Japan . | |
| 5-121556 | 5/1993 | Japan | 148/DIG. 55 |
| 6-53323 | 2/1994 | Japan | 438/233 |

*Primary Examiner*—Michael Trinh

[57] ABSTRACT

A method of manufacturing a semiconductor device including the steps of: forming an insulating film on an electrical connection area; forming a contact hole in the insulating film; forming a crystalline semiconductor region in the contact hole; forming a wiring layer covering the contact hole; and selectively implanting ions over the wiring layer by using a resist mask to make the crystalline semiconductor region have a high resistance. A semiconductor device having customized wiring connections can be manufactured in a short term.

28 Claims, 14 Drawing Sheets

A SEMICONDUCTOR DEVICE WIRED WITH FUSE

BACKGROUND OF THE INVENTION

1. Field of the Invention

The present invention relates to a semiconductor device customized to have a desired wiring connection and a method of manufacturing the same.

2. Description of the Related Art

FIG.6 is a cross sectional view of a semiconductor device illustrating a conventional method of connecting wiring layers. Some semiconductor devices such as a gate array have wiring connections tailored to a customer's special need. The method of connecting wiring layers will be described by taking a connection between a lower wiring layer 604 and an upper wiring layer 704 as an example. An interlayer insulating layer 701 is formed on the lower wiring layer 604. A via hole is formed in the interlayer insulating layer 701 by photolithography for the connection between the lower and upper wiring layers 604 and 704.

An embedded conductor 702 is grown on the lower wiring layer 604 in the via hole formed in the interlayer insulating layer 701. Such embedded conductor 702 is called as a plug.

Thereafter, the upper wiring layer 704 is deposited on the interlayer insulating layer 701. The upper and lower wiring layers 704 and 604 are electrically connected by the embedded conductor 702.

As described above, the connection between the upper and lower wiring layers 704 and 604 of a conventional semiconductor device has been achieved by forming a via hole in the interlayer insulating layer 701 and filling the via hole with the embedded conductor 702.

A gate array type semiconductor device has a number of gates capable of being commonly used by customers regardless of a different need of each customer. By changing connections between these gates, a variety of customized semiconductor devices can be manufactured.. However, for each connection between gates, it is necessary to form a via hole and a wiring pattern satisfying the need of each user. In order to form a wiring pattern, it is necessary to design and form a mask and perform a number of processes including a lithography process. These manufacturing processes takes a long time.

SUMMARY OF THE INVENTION

It is an object of the present invention to provide a method of manufacturing a semiconductor device capable of connecting interlayer wiring layers in a short time.

According to one aspect of the present invention, there is provided a method of manufacturing a semiconductor device comprising the steps of: forming a first insulating film on an electrical connection area; forming a first contact hole in the first insulating film; forming a first crystalline semiconductor region in the first contact hole, forming a first wiring layer covering the first contact hole; and selectively implanting ions over the first wiring layer by using a resist mask to make the first crystalline semiconductor region have a high resistance.

The electrical connection area and the wiring layer are electrically connected by the crystalline semiconductor region formed in the contact hole. The crystalline semiconductor region in the contact hole can be made highly resistive by implanting ions therein. It is therefore possible to selectively disconnect the electrical connection area from the wiring layer. Since the connection area and the wiring layer can be selectively disconnected easily, a larger number of wiring layers can be formed in the semiconductor device. Therefore, upon reception of orders, a number of different type custom semiconductor devices can be shipped in a short term.

DETAILED DESCRIPTION OF THE PREFERRED EMBODIMENTS

Figure 1:
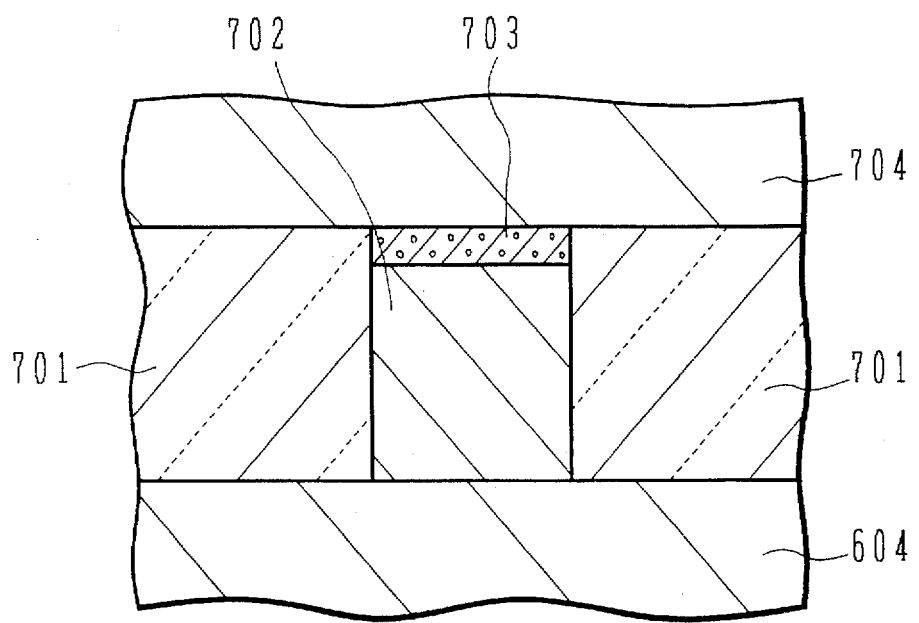
FIG.1 is a cross sectional view of a semiconductor device according to an embodiment of the invention.

FIG.1 is a cross sectional view showing the structure of a semiconductor device according to an embodiment of the invention. For example, in a gate array semiconductor device, desired wiring connections between gates can be formed in a short time.

On a lower wiring layer 604, an interlayer insulating layer 701 is formed. A via hole is formed in the interlayer insulating layer 701 by photolithography for the connection between the lower wiring layer 604 and an upper wiring layer 704. An embedded conductor (a plug) 702 is selectively grown on the lower wiring layer 604 in the via hole. A polysilicon layer 703 is formed on the embedded conductor 702. The embedded conductor 702 and polysilicon layer 703 fill the via hole formed in the interlayer insulating layer 701.

The upper wiring layer 704 is thereafter formed on the interlayer insulating layer 701 and polysilicon layer 703. The upper and lower wiring layers 704 and 604 are electrically connected by the embedded conductor 702 and polysilicon layer 703.

The above processes are performed commonly for all semiconductor devices with gates, irrespective of whether or not the upper and lower wiring layers 704 and 604 are electrically connected at the last process.

At a customizing process, wiring layers are selectively disconnected. The polysilicon layer 703 has a fuse function. Prior to the customizing process, all fuses are electrically conductive.

The upper and lower wiring layers 704 and 604 can be electrically disconnected by a desired fuse constituted by the polysilicon layer 703 at the customizing process. The details of the customizing process will be later given. At the customizing process, wiring connections suited to a specific need of a customer can be formed, and additional wiring layers are formed if necessary. Semiconductor devices having a variety type of circuit functions can be shipped to customers in a short term.

Next, the method of manufacturing a semiconductor device with a customized circuit will be explained by taking a complementary metal-oxide-semiconductor device (CMOS) as an example.

Figure 2A:
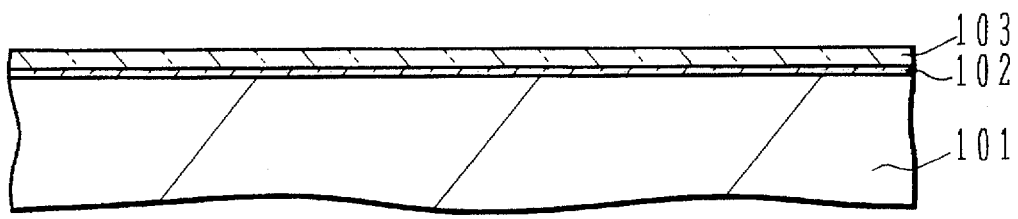
FIGS.2A to 2S are cross sectional views illustrating a method of manufacturing a CMOS semiconductor device according to an embodiment of the invention.

As shown in FIG.2A, a p-type Si substrate is prepared having a (1 0 0) plane and doped with B (boron) to $3\times10^{15}$ atoms/cm$^3$. An SiO$_2$ film 102 of about 30 nm thick is formed on the surface of the substrate 101 by thermal oxidation. An SiN$_x$ film 103 of about 140 nm thick is formed on the SiO$_2$ film 102 by low pressure chemical vapor deposition (CVD).

Figure 2B:
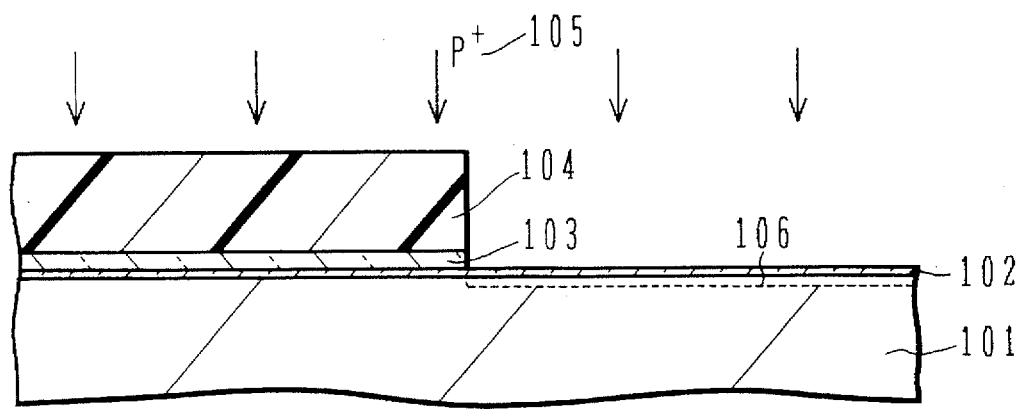

As shown in FIG.2B, resist is coated on the SiN$_x$ film 103. The resist is exposed and developed to form a resist mask 104. By using this resist mask 104 as an etching mask, the SiN$_x$ film 103 is selectively etched by dry etching using a mixed gas of SF$_6$ and He.

By using the resist mask 104 and the underlying SiN$_x$ film 103 as a mask, P$^+$ ions 105 are implanted under the conditions of an ion implantation energy of 100 keV and a dose of $1.5\times10^{13}$ cm$^{-2}$, to form a P$^+$ ion implanted layer 106 under the SiO$_2$ film 102. The resist mask 104 is thereafter removed.

Figure 2C:
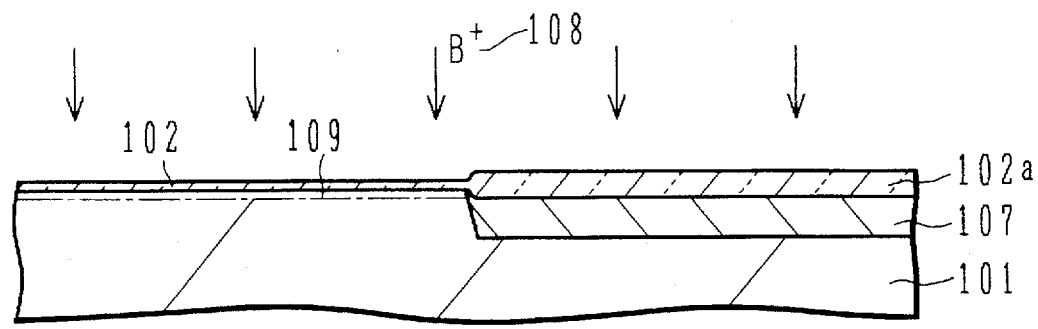

Next, as shown in FIG.2C, activation of the ion implanted layer 106 and drive-in of the impurities are performed by a thermal treatment at 1100° C. for 200 minutes in an oxidizing atmosphere to form an n-type well 107. With this thermal treatment, the substrate surface not covered with the SiN$_x$ film 103 is thermally oxidized and a thick oxide film 102a of local oxidation of silicon (LOCOS) is formed. Thereafter, the SiN$_x$ film 103 is etched and removed.

B$^+$ ions 108 are implanted under the conditions of an ion implantation energy of 30 keV and a dose of $1.5\times10^{13}$ cm$^{-2}$. These ion implantation conditions are selected such that B$^+$ ions do not penetrate through the thick LOCOS oxide film 102a over the n-type well 107. A B$^+$ ion implanted layer 109 is formed only under the thin oxide film 102.

Figure 2D:
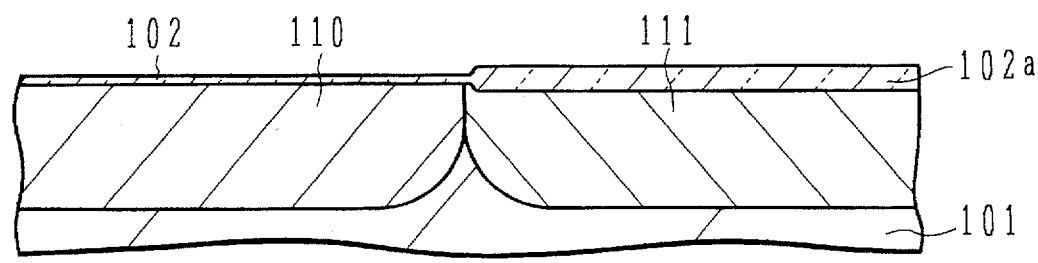

As shown in FIG.2D, activation of the ion implanted layer 109 and drive-in of the impurities B are performed by a thermal treatment at 1150° C. for 240 minutes to form a p-type well 110. At this time, P$^+$ ions in the n-type well 107 are also thermally diffused and an n-type well 111 is formed. Thereafter, the SiO$_2$ films 102 and 102a on the substrate surface are etched and removed.

Figure 2E:
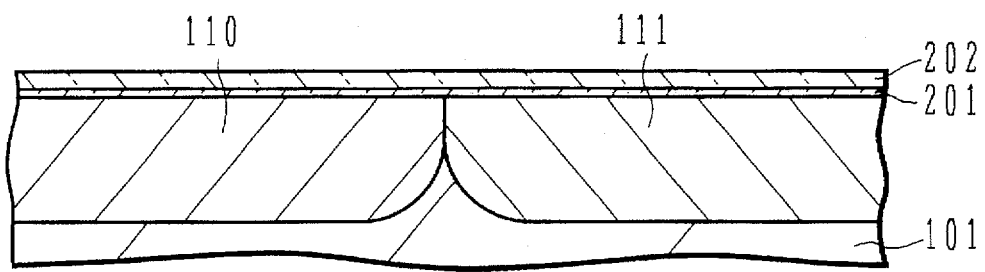

As shown in FIG.2E, a new SiO$_2$ film 201 is formed to a thickness of about 15 nm on the substrate surface by thermal oxidation. An SiN$_x$ film 202 of about 140 nm thick is formed on the SiO$_2$ film 201 by low pressure CVD. Although not shown, at the boundary between the p- and n-type wells 110 and 111, a step is formed which is a mark of the LOCOS oxide Film 102 used as the ion implantation mask for the p-type well 110.

Figure 2F:
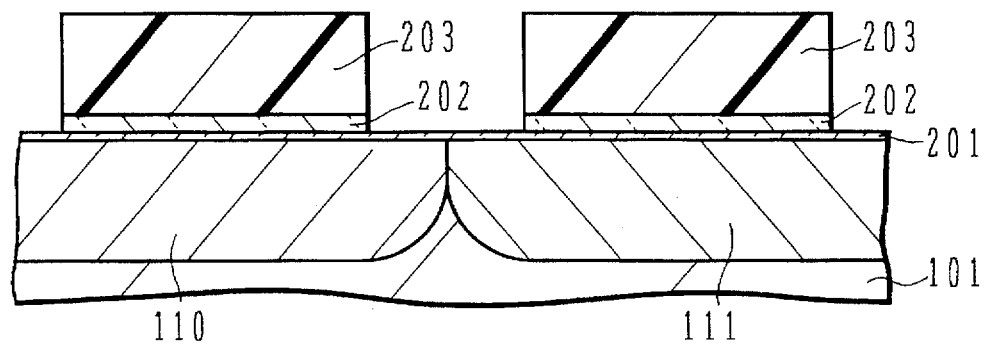

As shown in FIG.2F, resist is coated on the surface of the SiN$_x$ film 202. The resist is exposed and developed to form a resist mask 203 covering the active regions. By using the resist mask as an etching mask, the SiN$_x$ film 202 is selectively etched.

Figure 2G:
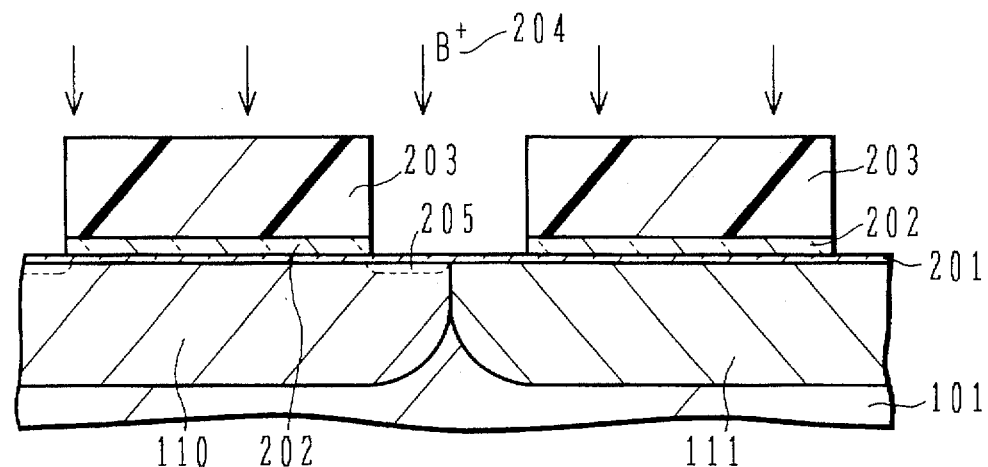

As shown in FIG.2G, by using the resist mask 203 and the underlying SiN$_x$ film 202 as an ion implantation mask, B$^+$ ions 204 are implanted under the conditions of an ion implantation energy of 30 keV and a dose of $4.5\times10^{12}$ cm$^{-2}$. Implanted B$^+$ ions penetrate through the exposed oxide film and reach the shallow surface region of each well layer. B$^+$ ions implanted into the p-type well 110 form an ion implanted layer 205. Although a similar ion implanted layer is formed in the n-type well, this layer has no positive function. Thereafter, the resist mask 203 used as the ion implantation mask is removed.

Figure 2H:
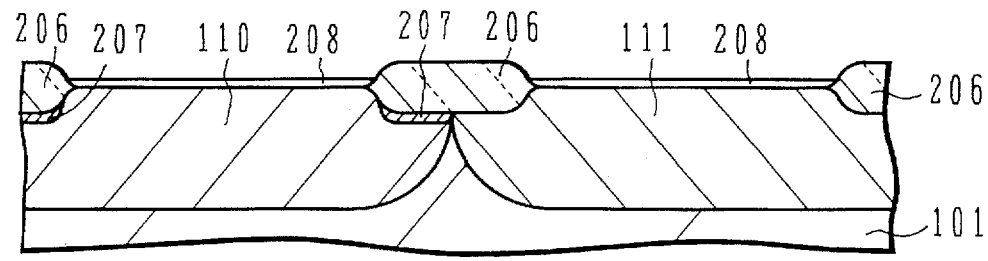

As shown in FIG.2H, by using the SiN$_x$ as a mask, a field oxide film 206 is formed to a thickness of about 400 nm by thermal oxidation. At this thermal oxidizing process, B$^+$ ions in the ion implanted layer 205 are diffused and activated to form a channel stop layer 207 having an impurity concentration higher than the p-type well 110. Thereafter, the SiN$_x$ film 202 and the underlying SiO$_2$ film 201 used as the mask at the thermal oxidizing process are removed by wet etching. Thereafter, an SiO$_2$ film 208 of 9.5 nm thick is formed over the whole surface of the substrate by thermal oxidation.

Figure 2I:
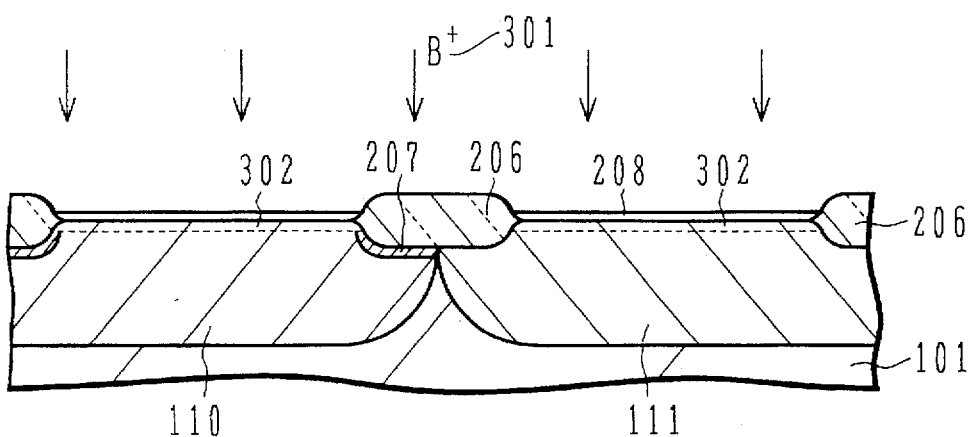

Next, as shown in FIG.2I, B$^+$ ions 301 are implanted under the conditions of an ion implantation energy of 15 keV and a dose of $1.5\times10^{12}$ cm$^{-2}$. This ion implanted layer 302 functions to control the threshold voltage of a MOS transistor of the semiconductor device.

Figure 2J:
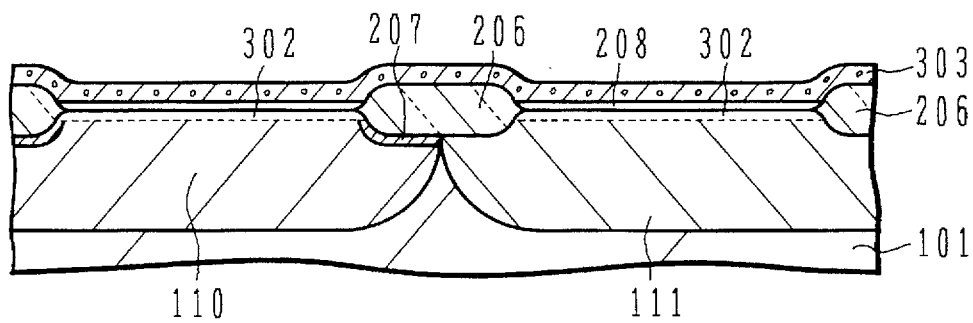
Figure 2K:
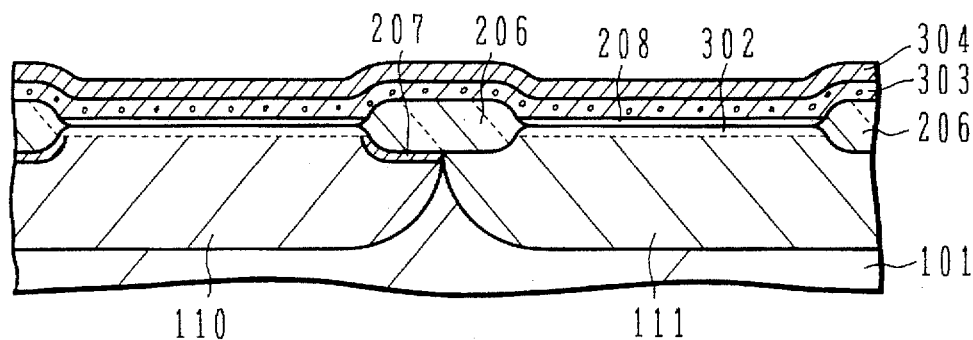

As shown in FIG.2J, a polysilicon film 303 of about 150 nm thick is formed over the whole surface of the substrate by low pressure CVD. P$^+$ (phosphorous) ions are highly doped in the polysilicon film 303. Thereafter, as shown in FIG.2K, a WSi film 304 of about 150 nm thick is formed on the polysilicon film 303 by sputtering. This structure of a laminate of the polysilicon layer and the metal silicide film formed thereon is generally called a polycide structure.

Figure 2L:
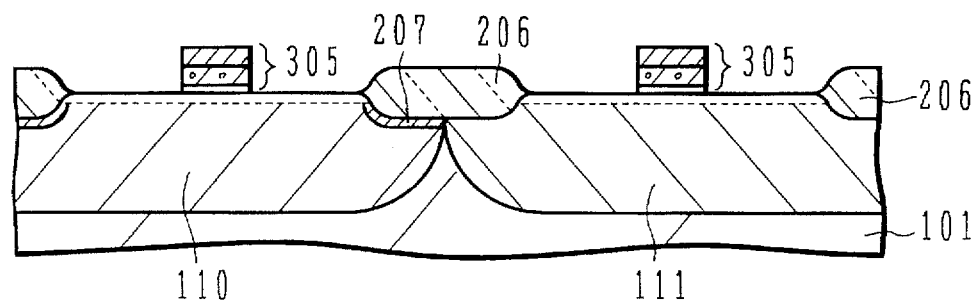

Resist is coated on the WSi film, exposed and developed to form a resist mask with a gate electrode pattern. By using this resist mask as an etching mask, the polycide layers 303 and 304 are selectively etched. After this etching, the resist film is removed. As shown in FIG.2L, the polycide layer left forms a gate electrode 305 on the active region defined by the field oxide film.

Figure 2M:
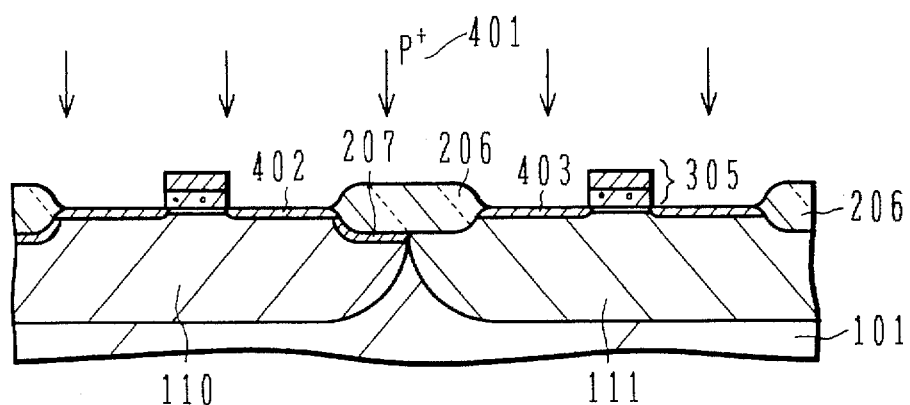

By using the gate electrode 305 and field oxide film 206 as an ion implantation mask. P$^+$ ions 401 are implanted over the whole surface of the substrate under the conditions of an ion implantation energy of 80 keV, a dose of $4.0\times10^{13}$ cm$^{-2}$, and an implantation angle of 45 degrees. As shown in FIG.2M, ion implanted layers 402 and 403 are formed in very shallow regions of the p-and n-type wells 110 and 111.

Figure 2N:
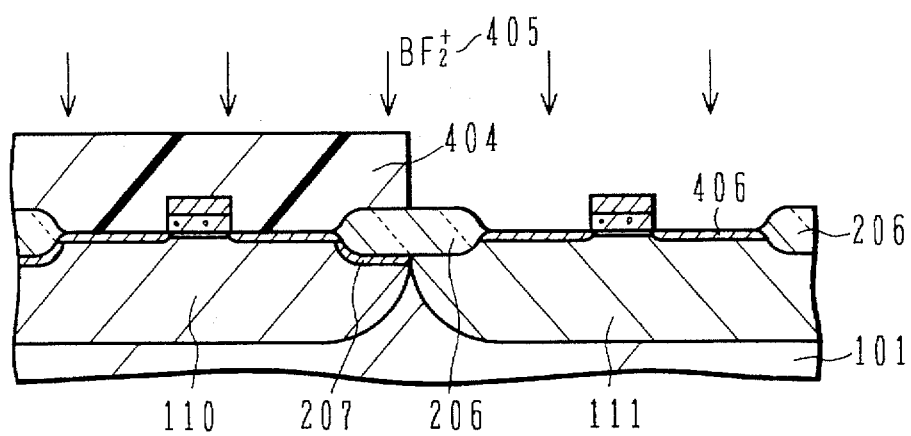

As shown in FIG.2N, a resist film is coated over the whole surface of the substrate. The resist film is exposed and developed to form an ion implantation mask 404 covering the p-type well 110. By using this resist mask as an ion implantation mask, BF$_2^+$ ions 405 are implanted under the conditions of an ion implantation energy of 65 keV, a dose of $2.5\times10^{14}$ cm$^{-2}$, and an implantation angle of 45 degrees. A BF$_2^+$ ion implanted layer 406 is formed in a very shallow region of the n-type well 111. In the BF$_2$ ion implanted layer 406, the B concentration is higher than the P concentration, and this region 406 becomes a p-type because of compensation between both the impurities.

Next, in order to activate BF$_2^+$, the substrate is heated to a temperature of 1100° C. in 10 seconds and maintained at this temperature for 10 seconds, by using a rapid thermal annealing (RTA) system. The ion implanted layers 402 and 406 formed in the p- and n-type wells become regions of a lightly doped drain (LDD) structure.

Figure 2O:
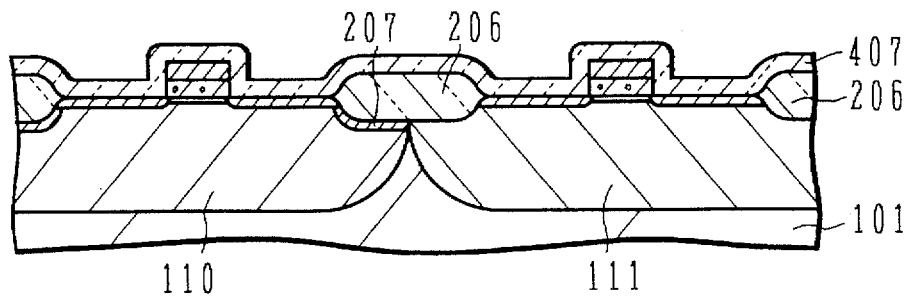
Figure 2P:
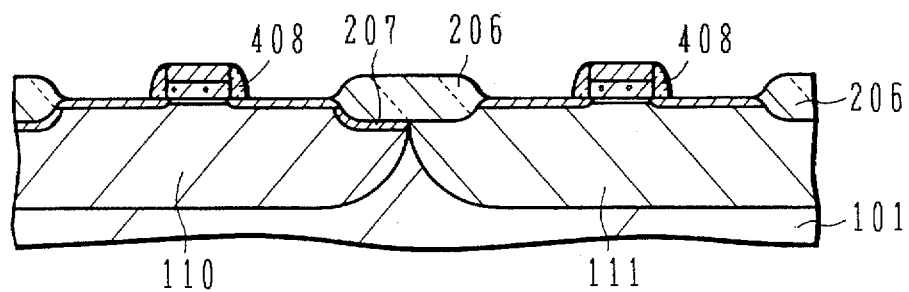

As shown in FIG.2O, an SiO$_2$ film 407 of about 200 nm is formed over the whole surface of the substrate by low pressure CVD using tetraethoxysilane (TEOS). Thereafter, the SiO$_2$ film 407 is etched by reactive ion etching (RIE) to leave SiO$_2$ regions 408 only at the side walls of the gate electrode 305, as shown in FIG.2P. This SiO$_2$ region 408 is generally called a side spacer or side wall oxide.

Next, the processes of forming junctions of the source/drain regions of p- and n-channel transistors will be described.

Figure 2Q:
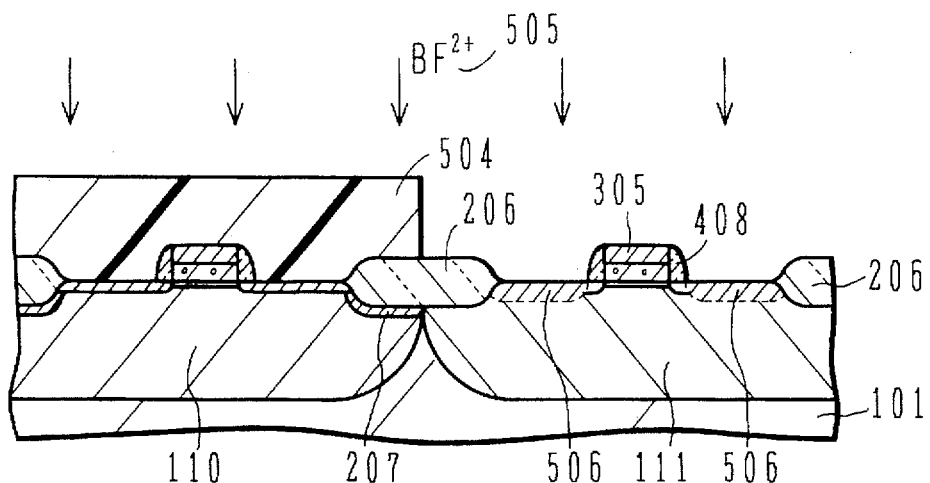

First, as shown in FIG.2Q, resist is coated over the whole surface of the substrate. The resist is exposed and developed to form a resist mask 504 covering the p-type well 110. By using this resist mask 504 as an ion implantation mask, $BF_2^+$ ions 505 imparting conductivity are implanted to form an ion implanted layer 506.

The ion implantation conditions are, for example, an ion implantation energy of 30 keV and a dose of $2.0\times10^{15}$ cm$^{-2}$. The resist mask 504 is thereafter removed.

Figure 2R:
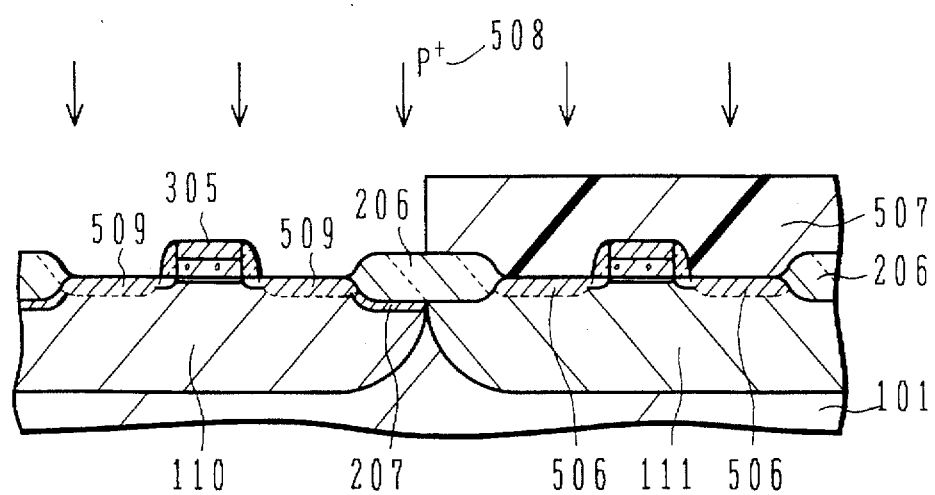

Next, as shown in FIG.2R, resist is coated over the whole surface of the substrate. The resist is exposed and developed to form a resist mask 507 covering the n-type well 111. By using this resist mask 507 as an ion implantation mask, $P^+$ ions 508 imparting conductivity are implanted to form an ion implanted layer 509.

The ion implantation conditions are, for example, &n ion implantation energy of 10 keV and a dose of $1.0\times10^{15}$ cm$^{-2}$. The resist mask 507 is thereafter removed.

Next, the substrate is heated to a temperature of 850° C. in 10 seconds and maintained at this temperature for 10 seconds, by using an NTA system. With this annealing process, the impurities in the ion implanted layers 506 and 509 are activated and the source/drain regions of the p- and n-channel transistors are formed.

An annealing process for further performing a drive-in of the source/drain regions may be performed under different conditions after the impurity activation annealing process, or it may be carried out by prolonging the time of the impurity activation annealing process. In this embodiment, such an annealing process is performed after a first interlayer insulating film is formed.

Figure 2S:
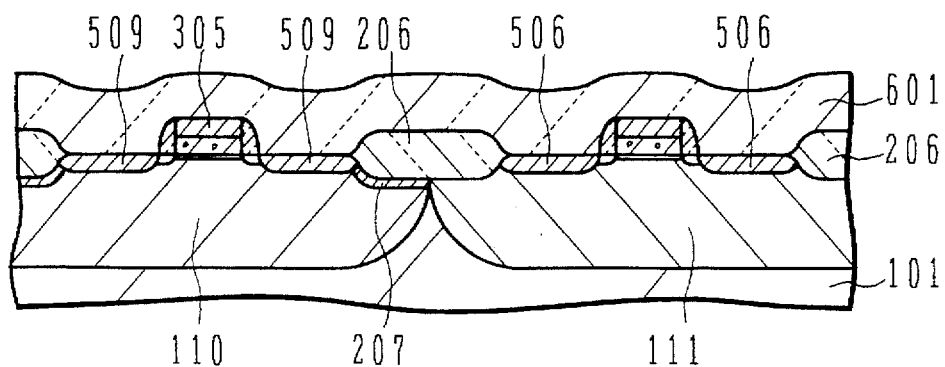

As shown in FIG.2S, the first interlayer insulating film 601 is formed over the whole surface of the substrate by atmospheric pressure CVD. The first interlayer insulating film 601 is made of two layers of a phosphosilicate glass (PSG) of about 100 nm and a borophosphosilicate glass (BPSG) of about 600 nm thick.

Thereafter, a thermal treatment is performed to heat the substrate to 1000° C. in 10 seconds and maintain it at this temperature for 10 seconds, to thereby further diffuse the impurities in the source/drain regions. With this annealing after the formation of the first interlayer insulating film, the interlayer insulating film is softened and fluidized so that the surface flatness thereof can be improved. Also, water contents in the first interlayer insulating film are evaporated so that the degradation of the transistor characteristics (such as a change in threshold voltage) to be caused by water contents can be avoided. The first interlayer insulating film may be formed after $P^+$ ions are implanted, and thereafter an impurity activation annealing and drive-in annealing are performed.

In the following processes, only an n-channel transistor of the CMOS semiconductor device will be described. A p-channel transistor can be formed by similar processes.

Figure 3A:
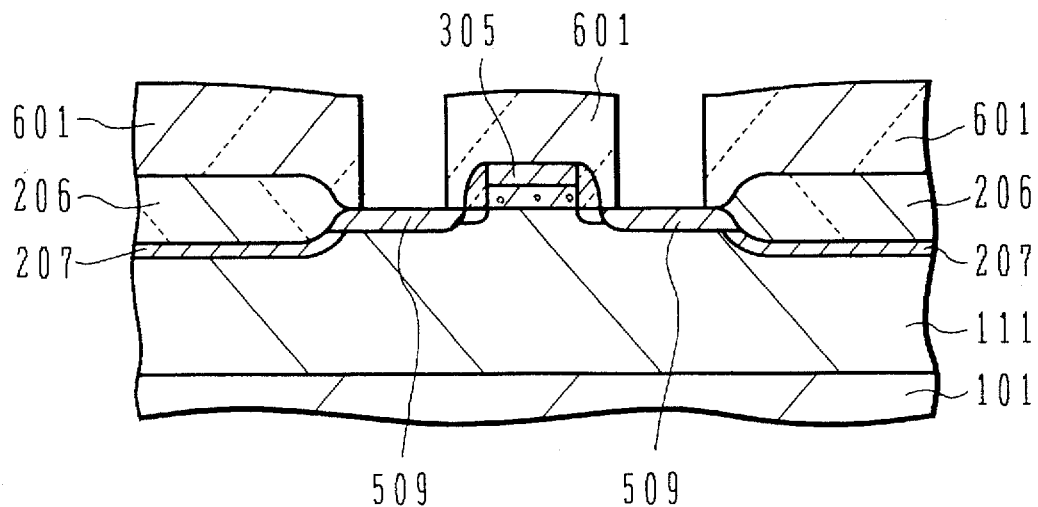
FIGS. 3A to 3J are cross sectional views illustrating the processes to be performed after the process illustrated in FIG.2S.

Forming contact holes will be described with reference to FIG.3A. First, resist is coated over the whole surface of the substrate. The resist is exposed and developed to form a resist mask having an opening for each contact hole, By using this resist mask as an etching mask, the first interlayer insulating film 601 is selectively etched to form contact holes for wiring connections. Thereafter, the resist mask is removed.

Figure 3B:
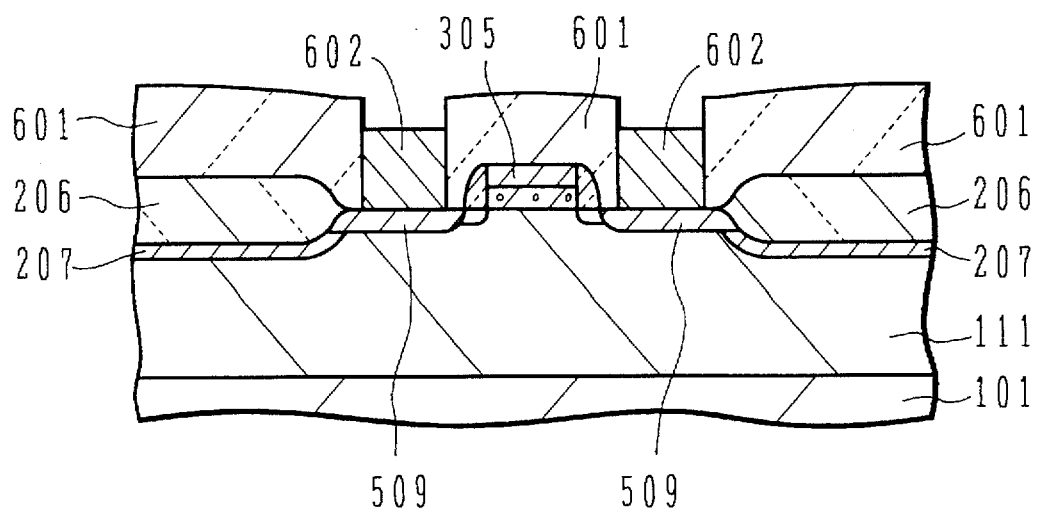

Next, as shown in FIG.3B, a tungsten (W) film of about 600 nm thick is selectively deposited on the ion implanted layer 509 at the bottom of the contact hole by low pressure CVD using $WF_6$. A conductor (a W plug) 602 is therefore embedded in the contact hole. The thickness of the embedded conductor 602 is preferably ¾ the thickness of the first interlayer insulating film 601 or thicker.

Figure 3C:
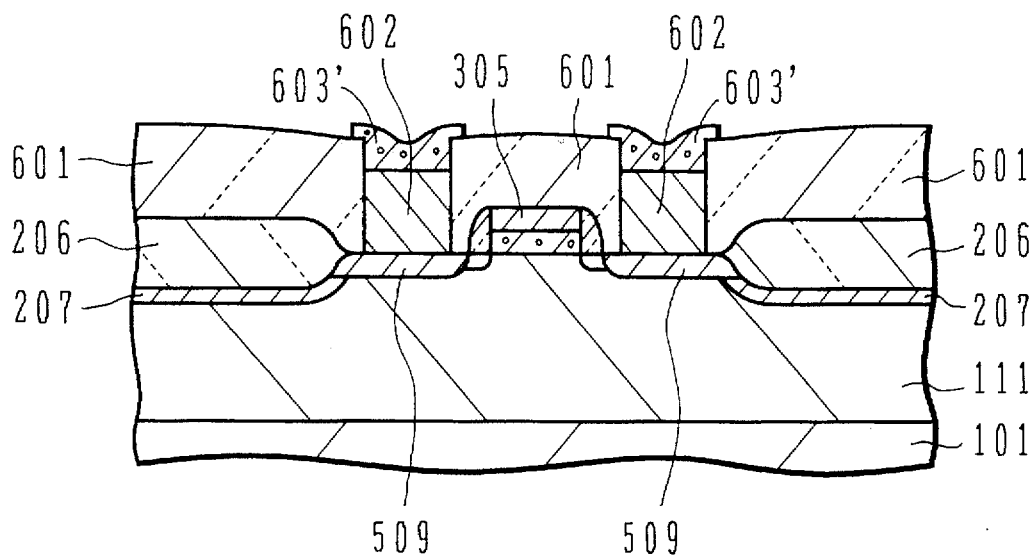

As shown in FIG.3C, an amorphous silicon layer 603' of 100 nm thick is formed over the whole surface of the substrate by CVD or sputtering. In the ease of CVD, the amorphous silicon layer 603' is formed by reduction reaction of $SiH_4$ (silane) or $Si_2H_6$ (disilane). In the case of sputtering, a silicon target is sputtered by An or other ions. The thickness of the amorphous silicon layer 603' is preferably 200 nm or thinner.

Next, impurity ions of group III or V such as $B^+$ and $P^+$ ions are implanted into the amorphous silicon layer 603'. The ion implantation conditions are, for example, an ion implantation energy of 10 keV and a dose of $1.0\times10^{15}$ cm$^{-2}$. The implantation energy is required to be set such that ions do not penetrate through the amorphous silicon layer 603'.

Next, resist is coated over the whole surface of the substrate, exposed and developed to Form a resist mask. By using this resist mask as an etching mask, the amorphous silicon layer 603' is selectively etched to leave it at a desired area.

In the above processes, the amorphous silicon layer 603' of a desired pattern is formed by depositing an amorphous silicon layer over the whole surface of the substrate by CVD or sputtering and selectively etching it by using a resist mask. The amorphous silicon layer 603' may be formed by different methods. For example, amorphous silicon may be selectively grown on the embedded conductor 602 in the contact hole to form the amorphous silicon layer 603'. In this case, an etching process is unnecessary. In selectively growing amorphous silicon, it is not necessarily required to fill the whole contact hole with the embedded conductor 602 and amorphous silicon layer 603', but they may be filled in to some depth of the contact hole and the upper space of the contact hole may be filled with a first wiring layer 604 to be formed at a later process. In this case, the embedded conductor 602 and amorphous silicon layer 603' are preferably filled in the contact hole to the level of 100 nm or shallower from the upper edge of the contact hole.

In the above process, the embedded conductor 602 is thinner than the thickness of the first interlayer insulating film 601 (equal to the depth of the contact hole). The embedded conductor 602 may be formed to the thickness of the first interlayer insulating film 601 or thicker. In this case, the amorphous silicon layer 603' is formed on the first interlayer insulating film 601, covering the embedded conductor 602. In order to flatten the amorphous silicon layer 603' and make it have a constant thickness, the thickness of the embedded conductor 602 is required to be generally the same as that of the first interlayer insulating film 601. For example, the thickness of the embedded conductor is preferably thinner by 0 to 200 nm than the thickness of the first interlayer insulating film 601.

Figure 3D:
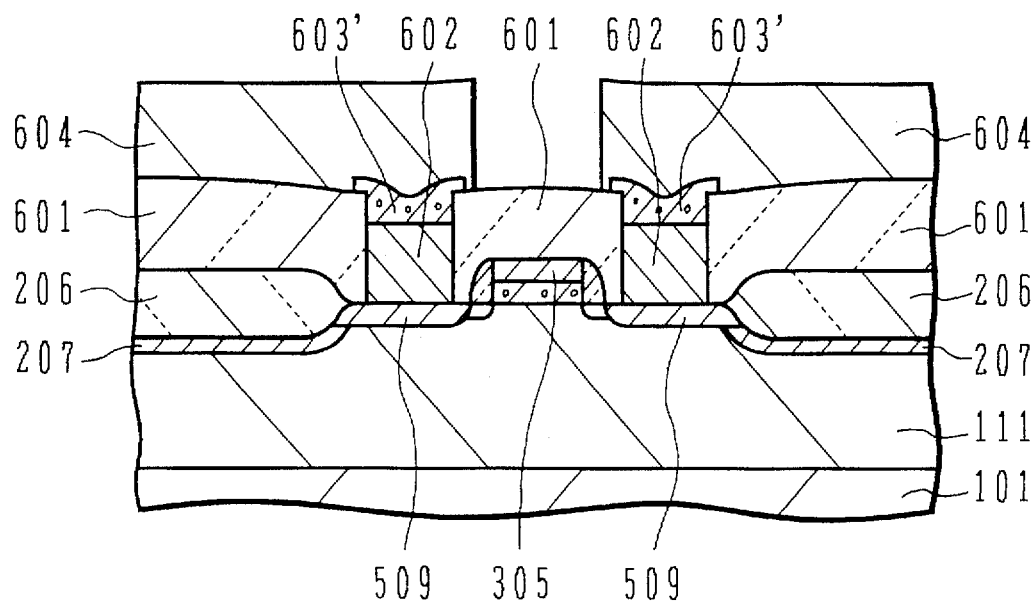

Next, as shown in FIG.3D, polysilicon or W is deposited on the whole surface of the substrate to a thickness of about 800 nm by low pressure CVD to form the first wiring layer 604. In the case of polysilicon, impurities are doped by ion implantation or doped polysilicon is used. The ion implantation conditions are, for example, an ion implantation energy of 45 keV and a dose of $1.0\times10^{16}$ cm$^{-2}$.

Next, resist is coated over the whole surface of the substrate, exposed and developed to form a resist mask having a wiring pattern. By using this resist mask as an etching mask, the first wiring layer 604 is patterned to have a desired wiring pattern.

Figure 3E:
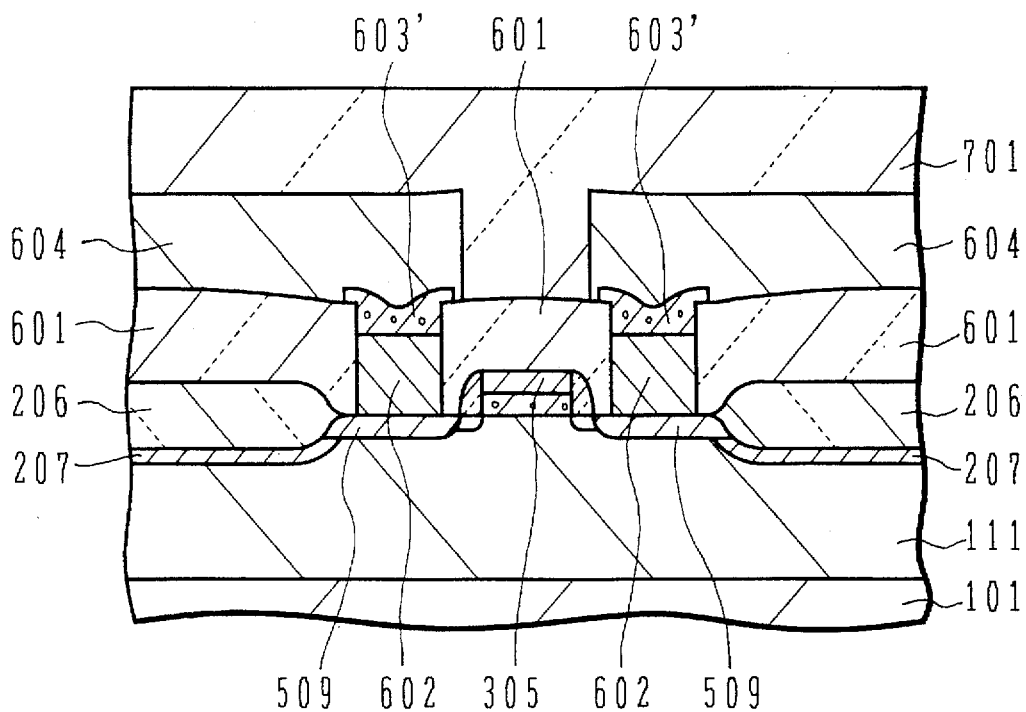

As shown in FIG.3E, a second interlayer insulating film 701 is formed over the whole surface of the substrate by atmospheric pressure CVD. The second interlayer insulating film 701 is of a two-layer structure formed by a phosphosilicate glass (PSG) film of about 100 nm thick and a borophosphosilicate glass (BPSG) film of about 1400 nm thick.

Next, the second interlayer insulating film 701 is removed by about 700 nm by chemical mechanical polishing (CMP).

Figure 3F:
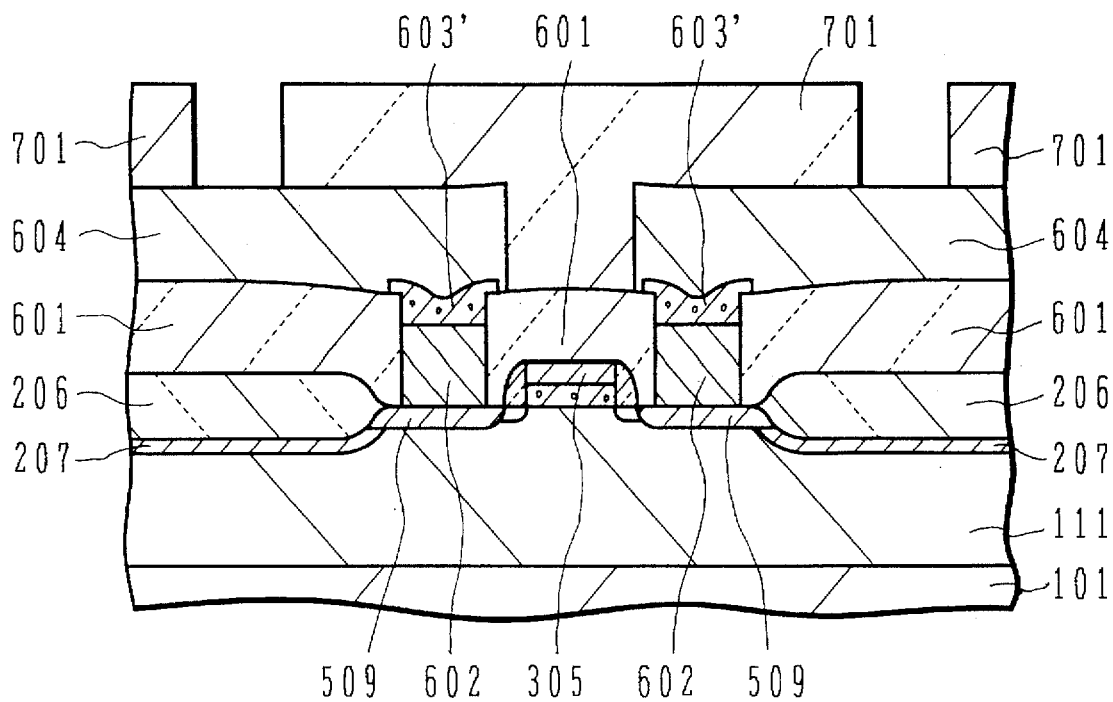

As shown in FIG.3F, resist is coated over the whole surface, exposed and developed to form a resist mask having an opening for a via hole. By using this resist mask as an etching mask, the second interlayer insulating film 701 is selectively etched to form therein a via hole for wiring connection. Thereafter, the resist mask is removed.

Figure 3G:
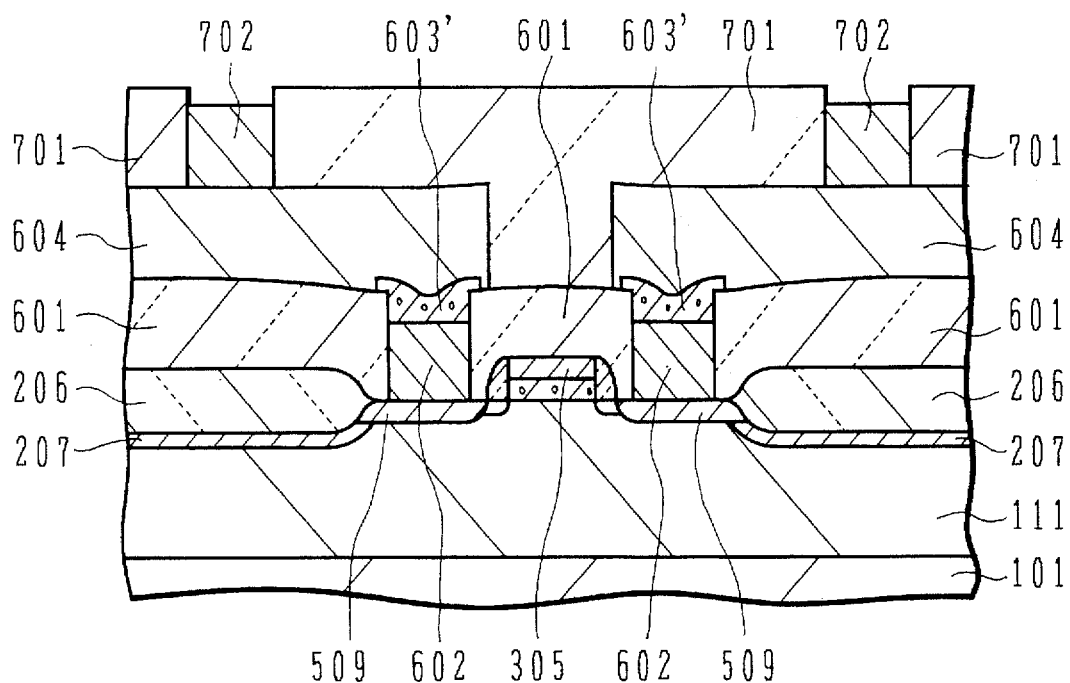

Next, as shown in FIG.3G, a tungsten (W) film of about 600 nm thick is selectively deposited on the ion implanted layer 604 at the bottom of the via hole by low pressure CVD using $WF_6$. A conductor (a W plug) 702 is therefore embedded in the via hole. The thickness of the embedded conductor 702 is preferably ¾ the thickness of the second interlayer insulating film 701 or thicker.

Figure 3H:
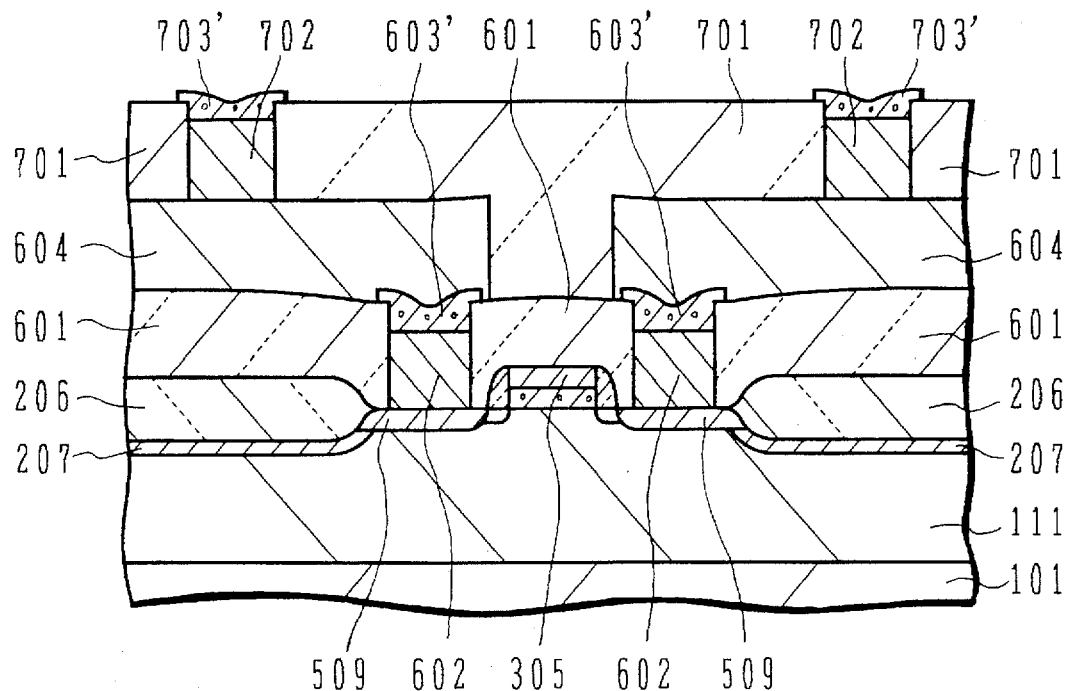

As shown in FIG.3H, an amorphous silicon layer 703' of 100 nm thick is formed over the whole surface of the substrate by CVD or sputtering. Next, impurity ions of group III or V such as $B^+$ and $P^+$ ions are implanted into the amorphous silicon layer 703'. The ion implantation conditions are, for example, an ion implantation energy of 10 keV and a dose of $1.0 \times 10^{15}$ $cm^{-2}$. The implantation energy is required to be set such that ions do not penetrate through the amorphous silicon layer 703'.

Next, resist is coated over the whole surface of the substrate, exposed and developed to form a resist mask. By using this resist mask as an etching mask, the amorphous silicon layer 703' is selectively etched to leave it at a desired area. Similar to the amorphous silicon layer 603', the amorphous silicon layer 703' may be formed by selective growth. The thicknesses of the embedded conductor 702 and amorphous silicon layer 703' are not limited to the above-described values.

Thereafter, by using an RTA system with an infrared lamp, the substrate is subjected to a thermal treatment to heat it to a temperature of 1000° C. in 10 seconds and maintain it at this temperature for 10 seconds. This annealing process (thermal treatment) crystalize the amorphous silicon layers 603' and 703' to form a polysilicon layers 603 and 703.

Figure 3I:
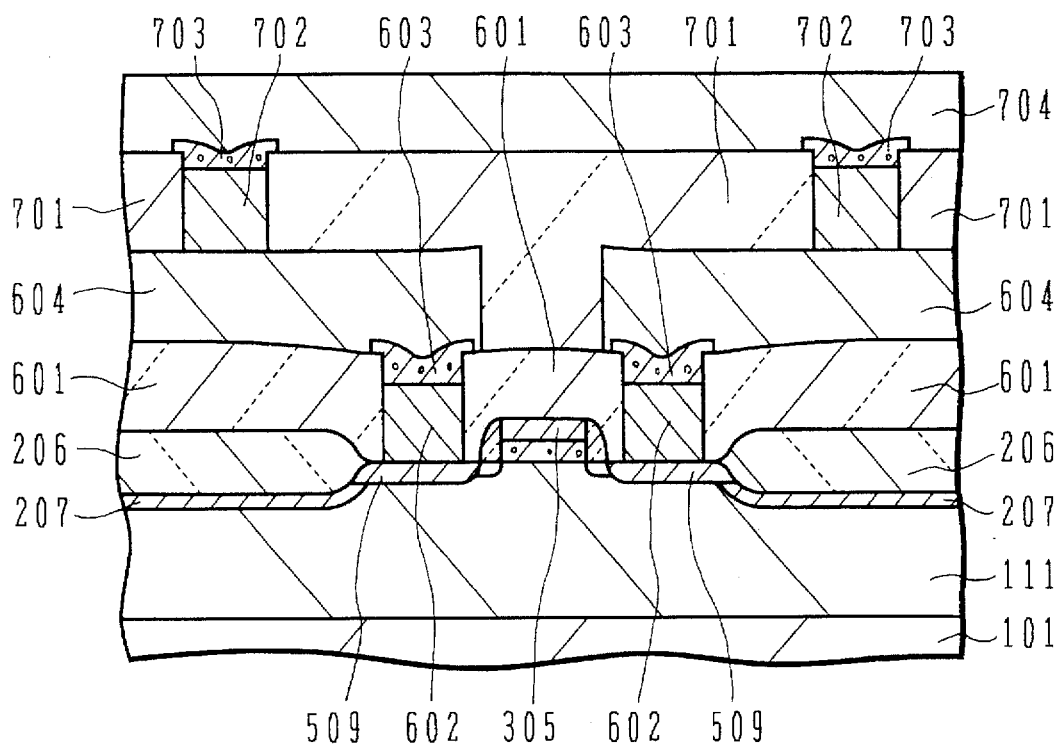

As shown in FIG.3I, a barrier metal layer such as TiN and TiW of about 100 nm thick is formed over the whole surface of the substrate by sputtering. Then, an Al alloy film of about 800 nm thick is formed on the barrier metal by sputtering. The Al alloy film is made of three components of Al-Si-Cu.

Resist is coated over the whole surface of the substrate, and exposed and developed to form a resist mask with an electrode/wiring pattern. By using this resist mask as an etching mask, the barrier metal and Al alloy film are selectively etched to form a second wiring layer 704 having a desired pattern.

Figure 3J:
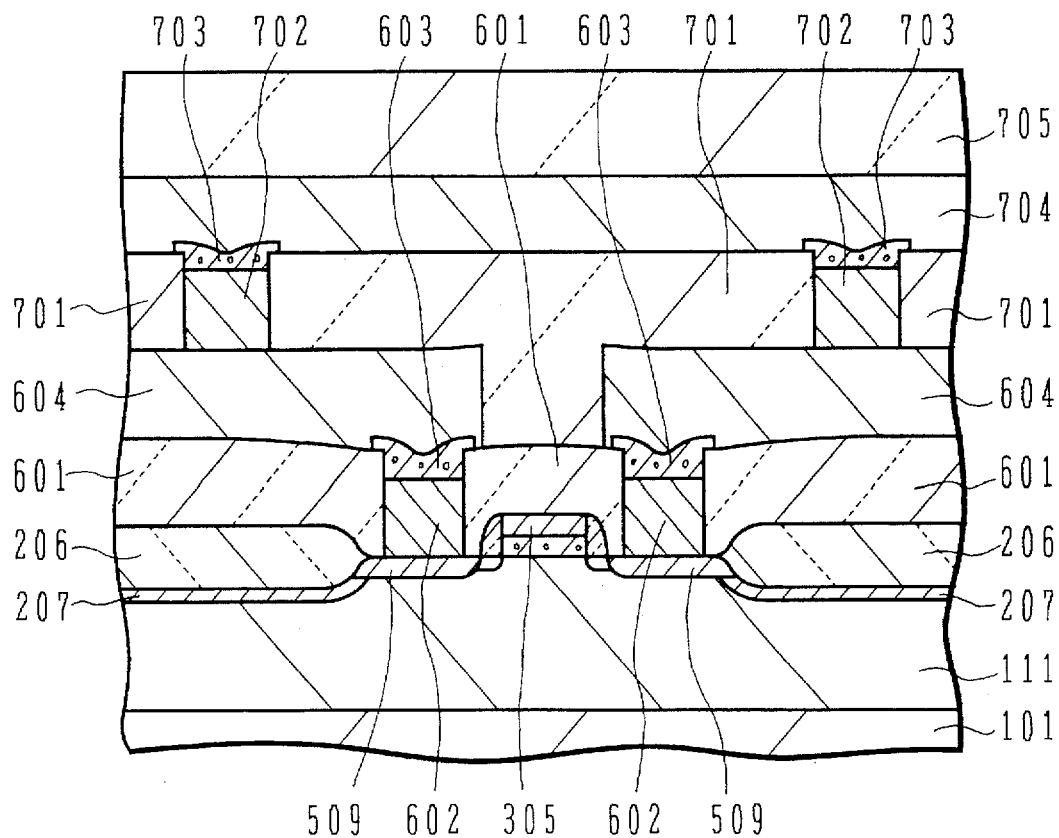

As shown in FIG.3J, a PSG film of about 500 nm thick and an $SiN_x$ film of about 500 nm are continuously deposited over the whole surface of the substrate by plasma CVD to Form a passivation film 705.

Resist is coated over the whole surface of the substrate, exposed and developed to form a resist mask having openings for bonding pads, scribe lines, and other necessary elements. By using this resist mask as an etching mask, the passivation film 705 is selectively etched to form openings therein for wiring connections to bonding pads or for other purposes.

Lastly, the substrate is annealed in a hydrogen atmosphere for 30 minutes at 400° C. to neutralize electric charges generated in the gate oxide film by damages during each process.

Although the amorphous silicon layers 603' and 703' are first formed and then crystallized to form the polysilicon layers 603 and 703, polysilicon may be deposited first by CVD or sputtering so as to dispense with the crystallizing process.

In depositing polysilicon, impurities may be doped thereafter or doped polysilicon may be deposited first so as to dispense with the impurity doping process.

As ion species for imparting conductivity, in addition to $B^+$, $BF_2^+$, and $P^+$, other ions may be used such as $As^+$ and $Sb^+$, and compound ions thereof.

In the above embodiment, an RTA system is used which can perform in a short time the annealing process for the activation of impurities and recrystallization of amorphous layers. As a heating means, a laser heating system or a resistor heating furnace may also be used with expected similar effects.

With the above manufacturing method, fuses of the polysilicon layers 603 are formed in the contact holes, and fuses of the polysilicon layers 703 are formed in the via holes.

The polysilicon layers 603 are served as fuses connecting the source/drain region 509 and first wiring layer 604, whereas the polysilicon layers 703 are served as fuses for interconnecting the first wiring layer 604 and second wiring layer 704.

A series of processes used commonly for all CMOS semiconductor devices has been described above. A customizing process is thereafter performed for determining wiring connections for each custom semiconductor device. With the customizing process, desired fuses of polysilicon layers 603 and 703 are blown (amorphized) to cut desired wiring patterns. Wiring patterns whose fuses of polysilicon layers 603 and 703 are not blown are maintained electrically conductive.

Figure 4:
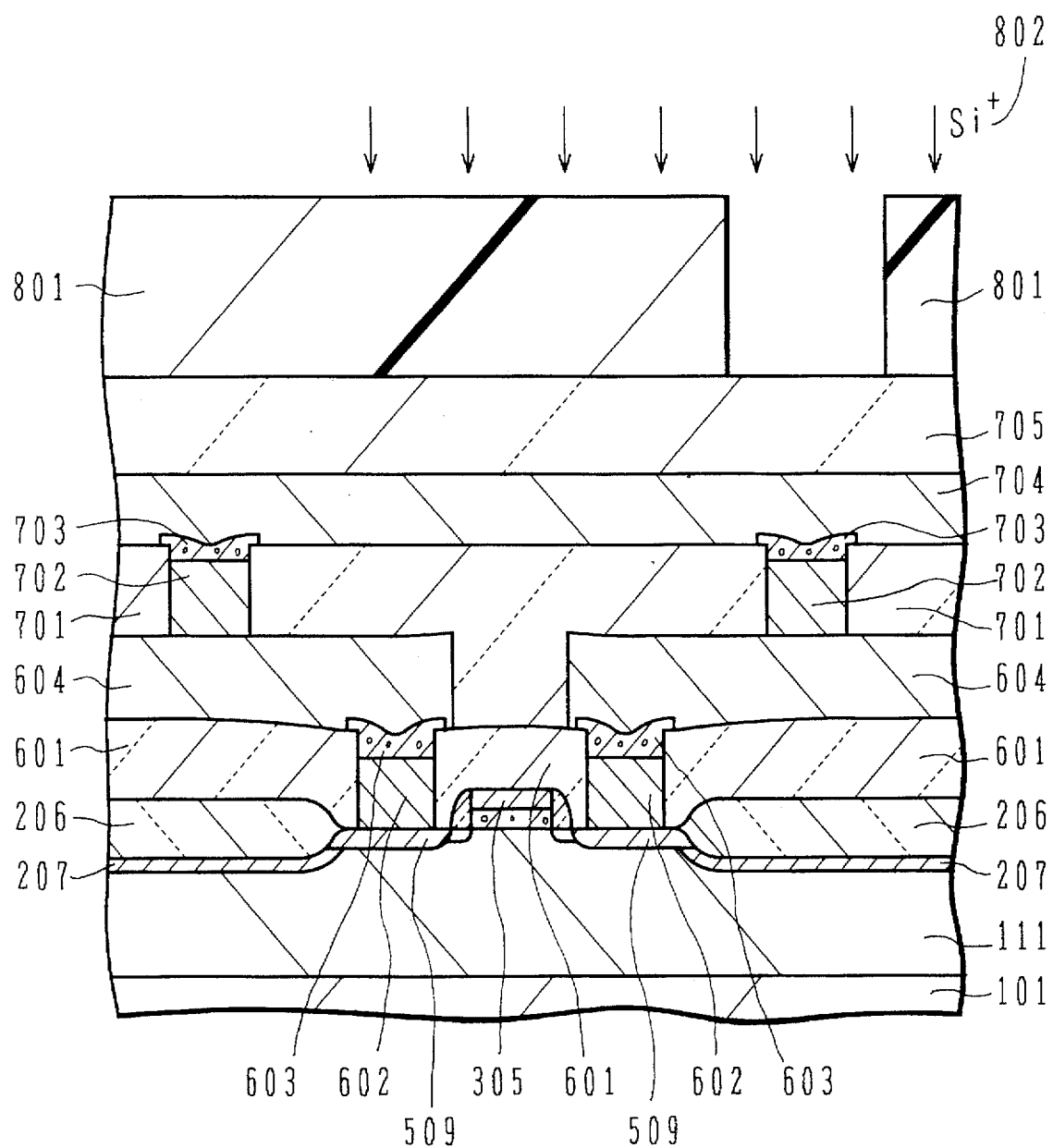
FIG.4 is a cross sectional view illustrating a process of connecting wiring layers of a semiconductor device according to an embodiment of the invention.

FIG.4 is a cross sectional view of a semiconductor device illustrating a customizing process For determining wiring connections of the device.

Resist 801 is coated on the uppermost passivation film 705 formed by the above-described method of manufacturing a semiconductor device, exposed and developed to form a resist pattern having an opening corresponding to the polysilicon layer 703 of the via hole to be electrically disconnected.

By using the resist mask 801 as an ion implantation mask, $Si^+$ ions 802 are implanted. This process is performed to amorphize the polysilicon layer 703 without affecting the passivation film 701 and second wiring layer 704. The ion implantation conditions are, for example, an implantation energy of 400 to 800 keV and a dose of $1.0 \times 10^{15}$ to $1.0 \times 10^{16}$ $cm^{-2}$.

The polysilicon layer 603 in the contact hole may be amorphized by implanting ions through a resist pattern 801 having an opening aligned at the polysilicon layer 603. Since the contact hole is at the position deeper than the via hole, the ion implantation conditions are different from those for the via hole, and, for example, an implantation energy of 600 to 1600 keV and a dose of $1.0 \times 10^{15}$ to $1.0 \times 10^{16}$ $cm^{-2}$.

The embedded conductors 702 and 602 are formed under the polysilicon layers 703 and 603, respectively. The mass number of W of the embedded conductors 702 and 602 is much larger than that of Si of the polysilicon layers 703 and 603. All ions are not implanted only in the polysilicon layers 703 and 603, but a fraction of ions penetrates through the polysilicon layers 703 and 603 and absorbed in the embedded conductors 702 and 602. The kinetic energy of ions is readily absorbed in the embedded conductors made of W having a large mass number.

The polysilicon layer amorphized by ion implantation has a high resistance of about 100 MΩ and is in a disconnected wiring state. The polysilicon layer not implanted with ions has a low resistance of about 100Ω and is a connected wiring state.

With the customizing process described above, a connection between a desired source/drain region 509 and the first wiring layer 604 and between the first and second wiring layers 604 and 704 can be maintained or lost.

As ion species used for customizing, in addition to Si, other ions not imparting conductivity may be used such as Ge, C, N, F, Cl, Ne, and At, and compound ions thereof.

Many types of ion species can be used to amorphize the polysilicon layers 603 and 703 to obtain a high resistance. A method of obtaining a high resistance is not limited only to amortization of the polysilicon layers 603 and 703.

For example, $O^+$ (oxygen) or $N^+$ (nitrogen) ions may be selected as ion species. As $O^+$ ions are implanted, the polysilicon layers 603 and 703 are amorphized and $SiO_x$ films are formed. If necessary, the substrate is thereafter annealed to form an $SiO_2$ insulating film at the same time.

An oxide film or nitride film formed by ion implantation makes the polysilicon films 603 and 703 have a high resistance and blow the fuse.

In the above example, a contact hole and a via hole are disposed at areas shifted to the left and right in the substrate. In this ease, the polysilicon layers in the contact hole and via hole are selectively amorphized to have a high resistance by implanting ions through the openings of a resist mask shifted to the left and right.

The contact hole and via hole may be disposed at areas in the same vertical axis. In this ease, ions are implanted (to customize the device) into a polysilicon layer 603 in the lower contact hole via the upper via hole.

This ion implantation into the region at a desired depth can be realized by optimizing the ion implantation conditions. By optimizing the ion implantation conditions, the polysilicon layer in either the contact hole or the via hole can be amorphized to have a high resistance. Both the contact hole and via hole at areas in the same vertical axis may also be amorphized to have a high resistance.

If the polysilicon layer 603 in the contact hole is to be amorphized to have a high resistance, ions are implanted into the polysilicon layer 603 via the polysilicon layer 703 and embedded conductor 702 in the via hole. In this case, the embedded conductor 702 is not necessarily required to be formed.

Figure 5:
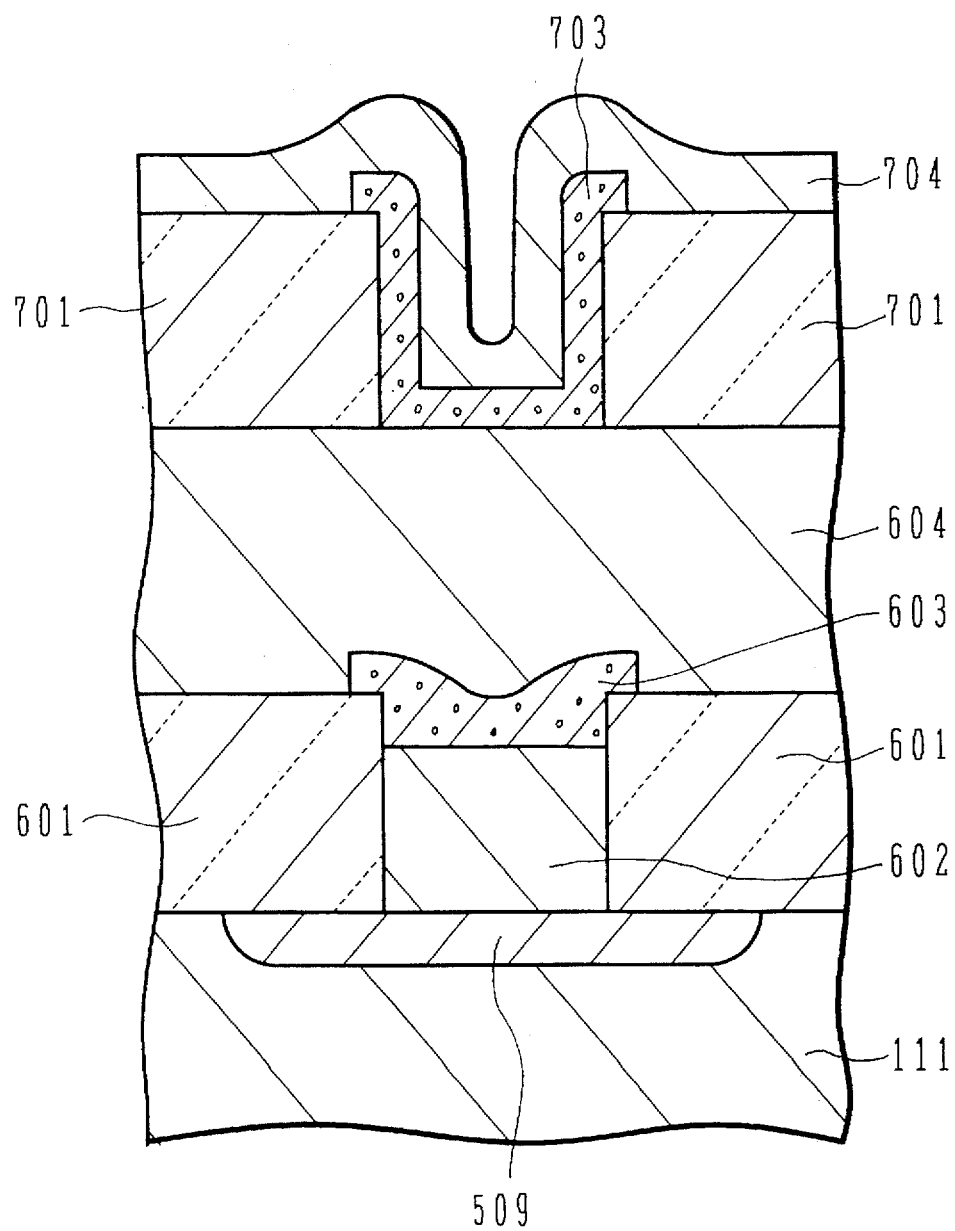
FIG.5 is a cross sectional view showing the structure of a semiconductor device according to another embodiment of the invention.
Figure 6:
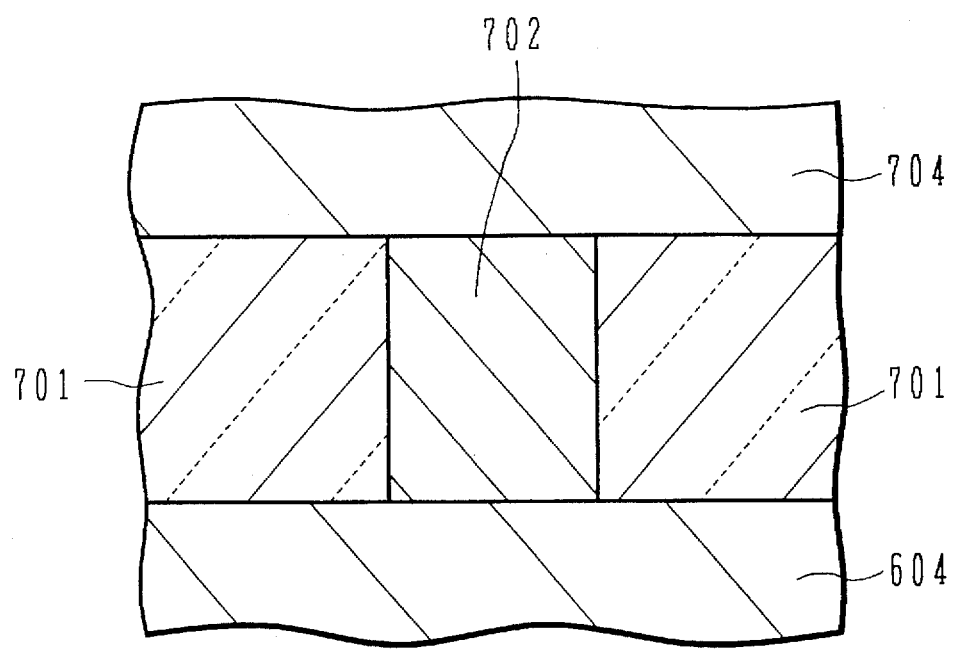
FIG.6 is a cross sectional view showing the structure of a conventional semiconductor device.

FIG.5 is a cross sectional view of a semiconductor device without an embedded conductor in a via hole.

The via hole is being disposed at an area in the same vertical axis as a contact hole. An embedded conductor 602 and a polysilicon layer 603 are formed in the contact hole over a source/drain region 509. An embedded conductor is not formed in the via hole. The process of forming the structure in the via hole will be described.

A second interlayer insulating film 701 is formed on a first wiring layer 604, and a via hole is formed in the second interlayer insulating film 701 by dry etching. Next, a polysilicon layer 703 is formed over the whole surface of the substrate by CVD or sputtering, and impurities imparting conductivity are implanted.

Thereafter, the substrate is annealed to activate impurities in the polysilicon layer 703, and a polysilicon pattern 703 is formed at a desired area by photolithography and etching.

A second wiring layer 704 made of barrier metal and an Al alloy film is formed in the same manner described previously.

A customizing process of this semiconductor device will be described. The customizing process for the polysilicon layer 703 in the via hole is performed in the same manner described previously, except under the different condition that an embedded conductor is not formed under the polysilicon layer 703. If the embedded conductor is formed, the polysilicon layer 703 can be made thin and the ion implantation time can be shortened.

In customizing the polysilicon layer 603 in the contact hole, ions are required to be implanted into the polysilicon layer 603 in the contact hole via the upper via hole.

In this case, in order not to damage the impurity diffused region 509 in the substrate by customizing ion implantation, the embedded conductor becomes necessary.

In the device shown in FIG.4, if the customizing process is performed only for the via hole, the polysilicon layer 603 in the contact hole may not be formed.

In the above embodiments, wiring connections For a contact hole and a via hole formed in two layers have been described. Via holes may be formed in three or more layers.

Since semiconductor devices of the above embodiments are customized by ion implantation, the high breakdown voltage structure is not needed. For example, a memory device programmable by a user, such as a PROM, uses a high voltage applied across a fuse area to blow it. Such a semiconductor device applied with a high voltage is required to thicken an insulating film and broaden a wiring pattern width and a space between wiring patterns.

However, in the above embodiments, wiring patterns are cut not by high voltage application but by ion implantation. Therefore, an insulating film is not required to be thickened and manufacture restrictions are less.

Many manufacture processes such as forming contact holes and via holes are commonly used irrespective of the types of custom semiconductor devices. Therefore, a variety type of customized semiconductor devices having desired wiring connections can be manufactured in a short term.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method of manufacturing a semiconductor device comprising the steps of:

(a) forming a first insulating film on an electrical connection area;

(b) forming a first contact hole in said first insulating film;

(c) forming a first crystalline semiconductor region in said first contact hole;

(d) forming a first wiring layer covering said first contact hole; and (e) selectively implanting ions over said first wiring layer by using a resist mask to make said first crystalline semiconductor region have a high resistance.

2. A method of manufacturing a semiconductor device according to claim 1, further comprising the step of:
(b-1) forming an embedded conductor including refractory metal under said first crystalline semiconductor region in said first contact hole, after said step (b).

3. A method of manufacturing a semiconductor device according to claim 1, wherein said step (e) amorphizes said first crystalline semiconductor region.

4. A method of manufacturing a semiconductor device according to claim 1, wherein said step (e) forms an insulating film in said first crystalline semiconductor region.

5. A method of manufacturing a semiconductor device according to claim 1, wherein said step (c) includes the step of forming an amorphous semiconductor region in said first contact hole and the step of annealing said amorphous semiconductor region.

6. A method of manufacturing a semiconductor device according to claim 1, wherein said step (a) forms said first insulating film on a source region or a drain region of a MOS transistor.

7. A method of manufacturing a semiconductor device According to claim 1, further comprising after said step (d) the steps of:
(d-1) forming a second insulating film on said first wiring layer;
(d-2) forming a second contact hole in said second insulating film;
(d-3) forming a second crystalline semiconductor region in said second contact hole; and
(d-4) forming a second wiring layer covering said second contact hole,
wherein said step (e) makes said first or second crystalline semiconductor region have a high resistance.

8. A method of manufacturing a semiconductor device according to claim 8, wherein said step (c) forms said first crystalline semiconductor region by polysilicon and said step (e) amorphizes said first crystalline semiconductor region by implanting Si (silicon) ions.

9. A method of manufacturing a semiconductor device according to claim 4, wherein said step (e) forms an insulating film in said first crystalline semiconductor region by implanting O (oxygen) ions.

10. A method of manufacturing a semiconductor device according to claim 6, further comprising the step of:
(b-1) forming an embedded conductor including refractory metal under said first crystalline semiconductor region in said first contact hole, after said step (b).

11. A method of manufacturing a semiconductor device comprising the steps of:
(a) providing a substrate having a lower conductive layer and an insulating layer thereover, the insulating layer having a hole therethrough on said lower conductive layer;
(b) forming a laminated conductive film comprising a first conductive film and a second conductive film formed on the first conductive film in the hole;
(c) forming an upper conductive layer on the laminated conductive film;
the laminated conductive film electrically connecting a lower conductive layer provided under the laminated conductive film and an upper conductive layer provided on the laminated conductive film; and
(d) selectively implanting ions into the second conductive film to disconnect electrical connection made through the laminated conductive film between the lower conductive layer and the upper conductive layer.

12. A method according to claim 11, wherein the first conductive film is formed in a plug shape, and the second conductive film is formed on the plug.

13. A method according to claim 11, wherein the first conductive film is a W plug.

14. A method according to claim 11, wherein the second conductive film is polysilicon.

15. A method according to claim 11, wherein the step (b) comprising the steps of:
(b-1) providing an amorphous silicon film serving as the second conductive film, on the first conductive film; and
(b-2) annealing the amorphous silicon film to transform the amorphous silicon into polysilicon.

16. A method according to claim 11, wherein the ions to be used for ion implantation in the step (d) comprises a material selected from a group consisting of Si, Ge, C, N, F, Cl, Ne, Ar and compound ions thereof.

17. A method according to claim 15, wherein in the step (d), the second conductive film of polysilicon is transformed into amorphous silicon by ion implantation.

18. A method for manufacturing a semiconductor device having a multilevel conductive layers of at least a first level conductive layer, a second level conductive layer and a third level conductive layer, comprising the steps of:
(a) providing a first level conductive film electrically connecting the first level conductive layer and the second level conductive layer;
(b) providing a second level conductive film electrically connecting the second level conductive layer and the third level conductive layer; and
(c) selectively implanting ions into the first level conductive film and the second level conductive film to selectively disconnect electrical connections made through the first level conductive film and the second level conductive film.

19. A method according to claim 18, wherein the first and second level conductive films are, each, formed with a plug film and a film formed on the plug film.

20. A method according to claim 18, wherein the step (a) further comprises the steps of:
(a-1) providing a plug film; and
(a-2) providing an amorphous silicon film on the plug film to collectively serve as the first level conductive film and
(a-3) annealing the amorphous silicon film to transform the amorphous silicon into polysilicon.

21. A method according to claim 18, wherein the step (b) further comprises the steps of:
(b-1) providing a plug film; and
(b-2) providing an amorphous silicon film on the plug film to collectively serve as the first level conductive film and
(b-3) annealing the amorphous silicon film to transform the amorphous silicon into polysilicon.

22. A method according to claim 18, wherein the ions to be used for ion implantation in the step (c) comprises a material selected from a group consisting of Si, Ge, C, N, F, Cl, Ne, Ar and compound ions thereof.

23. A method according to claim 18, wherein the ions are implanted into the first level conductive film with implantation energy of 600 to 1600 keV and a dose of $1.0 \times 10^{15}$ to $1.0 \times 10^{16}$ cm$^{-2}$.

24. A method according to claim 18, wherein the ions are implanted into the second level conductive film with implantation energy of 400 to 800 keV and a dose of $1.0 \times 10^{15}$ to $1.0 \times 10^{16}$ cm$^{-2}$.

25. A method according to claim 19, wherein the plug film is a W plug.

26. A method according to claim 19, wherein the film formed on the plug film is polysilicon.

27. A method according to claim 20, wherein the transformed polysilicon is transformed into amorphous silicon by ion implantation in the step (c).

28. A method according to claim 21, wherein the transformed polysilicon is transformed into amorphous silicon by ion implantation in the step (c).

* * * * *